United States Patent

Stahl et al.

[11] Patent Number: 5,982,636
[45] Date of Patent: Nov. 9, 1999

[54] SUPPORT ARRANGEMENT FOR MECHANICALLY SECURING AND ELECTRICALLY CONNECTING ELECTRONIC COMPONENTS SUCH AS LEDS AS WELL AS METHOD FOR ELECTRICALLY CONNECTING COMPONENTS TO THE SUPPORT MEMBER

[75] Inventors: Hermann Stahl, Steinheim/Murr; Uwe Windt, Oberstenfeld, both of Germany

[73] Assignee: Hermann Stahl GmbH, Grossbottwar, Germany

[21] Appl. No.: 09/059,595

[22] Filed: Apr. 10, 1998

[30] Foreign Application Priority Data

Apr. 11, 1997 [DE] Germany .......................... 197 15 093

[51] Int. Cl.$^6$ ...................................................... H05K 7/02
[52] U.S. Cl. ........................ 361/807; 361/809; 361/810; 174/255; 174/260; 439/937; 439/885; 206/713; 206/717
[58] Field of Search ..................................... 361/807, 809, 361/810, 627; 174/255, 260; 439/937, 885; 206/701, 713, 717

[56] References Cited

U.S. PATENT DOCUMENTS 3,852,849  12/1974  Pestka ........................................ 439/55
4,523,710  6/1985  Renshaw et al. ........................ 228/111
4,775,645  10/1988  Kurata et al. .............................. 438/28
5,725,930  3/1998  Ziberna .................................... 428/131

FOREIGN PATENT DOCUMENTS 2207012  1/1989  United Kingdom .

*Primary Examiner*—Leo P. Picard
*Assistant Examiner*—David Foster
*Attorney, Agent, or Firm*—Robert W. Becker & Associates

[57] ABSTRACT

A support arrangement for mechanically securing and electrically contacting electronic components has a support member consisting of an electrically conducting material and having a contacting side. The support member has perpendicularly projecting hollow pins at the contacting side. The hollow pins are stamped into the support member. The electronic components have connecting tabs including an opening. The tabs are placed onto the hollow pins. The hollow pins project through the openings and the tabs. The heads of the hollow pins are then mechanically deformed and engage radially outwardly the circumferential edge of the openings of the tabs.

9 Claims, 1 Drawing Sheet

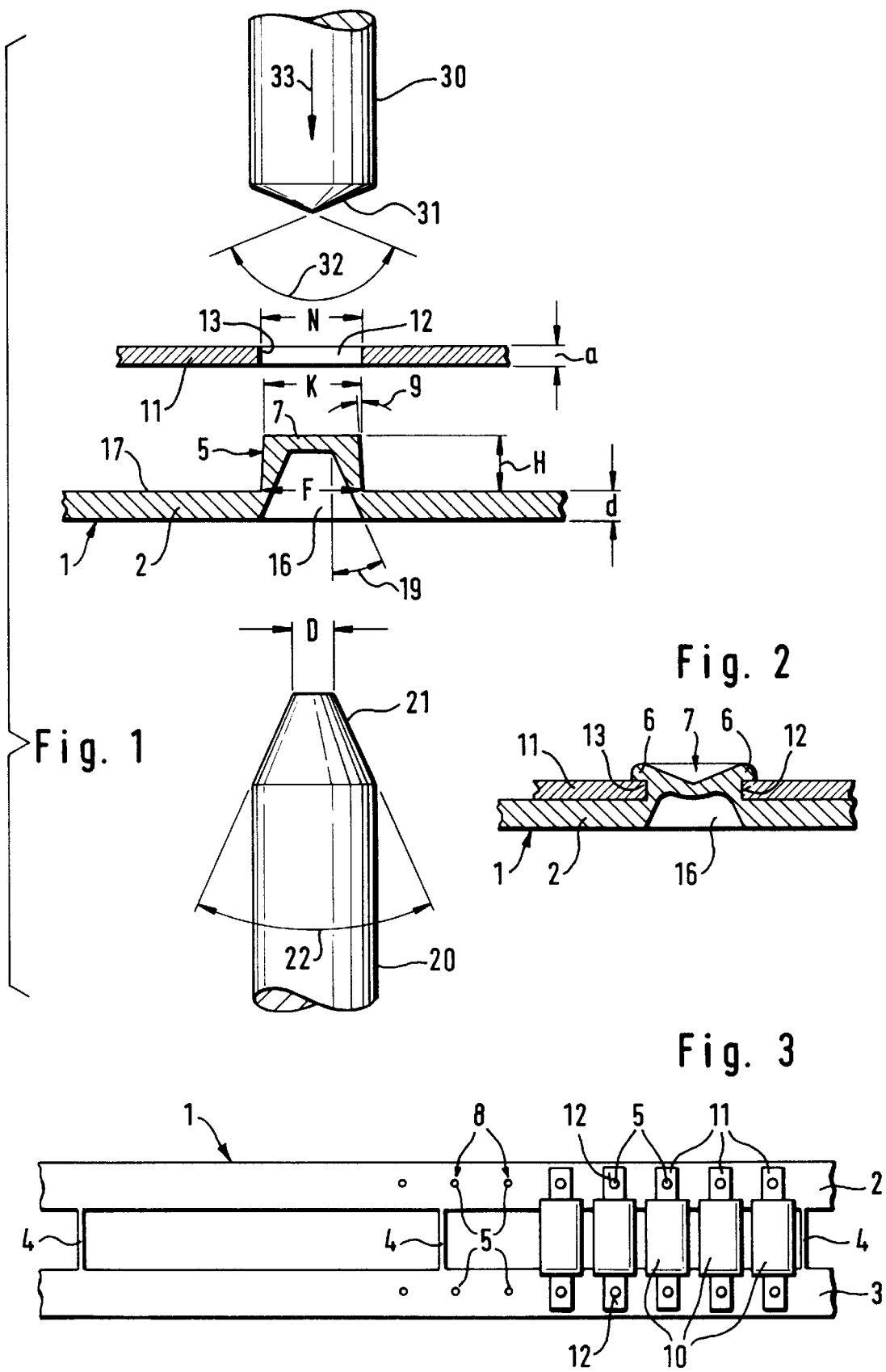

SUPPORT ARRANGEMENT FOR MECHANICALLY SECURING AND ELECTRICALLY CONNECTING ELECTRONIC COMPONENTS SUCH AS LEDS AS WELL AS METHOD FOR ELECTRICALLY CONNECTING COMPONENTS TO THE SUPPORT MEMBER

BACKGROUND OF THE INVENTION

The present invention relates to a support arrangement for mechanically securing and electrically connecting electronic components, especially LEDs. The support arrangement is comprised of an electrically conducting material with which the connecting tabs of the electronic components are electrically conductively connected.

The present invention also relates to a method for electrically conductively connecting components to a support member.

In today's automotive industry, conventional incandescent light bulbs are replaced more and more by LEDs with great luminance, especially in the area of tail lights. LEDs are mechanically more stable and have a longer service life so that lights with LEDs can be fixedly connected to the car body without requiring complicated access openings for exchanging light bulbs.

It is known to secure LEDs on electrically conducting support members in a mechanical manner. For this purpose, LEDs are provided with connecting tabs that must be positioned on the support member and electrically conductively connected thereto.

It is an object of the present invention to embody a support arrangement of the aforementioned kind such that the electronic components can be connected in a simple manner to the support member so that they are mechanically loadable to a high degree as well as well electrically connected to the support member.

SUMMARY OF THE INVENTION

A support arrangement for mechanically securing and electrically contacting electronic components according to the present invention is primarily characterized by:
  a support member consisting of an electrically conducting material and having a contacting side;
  the support member having perpendicularly projecting hollow pins at the contacting side, wherein the hollow pins are stamped into the support member;
  wherein the electronic components have connecting tabs including an opening and the tabs are placed onto the hollow pins;
  the hollow pins projecting through the opening of the tabs;
  wherein heads of the hollow pins are mechanically deformed and engage radially outwardly a circumferential edge of the openings of the tabs.

Advantageously, the hollow pins taper conically toward the head.

The diameter of the head is preferably smaller than the diameter of the opening, and the diameter of the hollow pins at the support member is greater than the diameter of the opening.

Advantageously, the hollow pins have a conically shaped interior tapering toward the head.

The exterior cone angle of the hollow pins is preferably smaller than the inner cone angle of the conically shaped interior.

Expediently, the wall thickness of the support member is greater than the wall thickness of the hollow pins.

The hollows pins, before being mechanically deformed, have a height of twice a wall thickness of the support member.

The hollow pins, before being mechanically deformed, project at least with half their height past the tabs.

Preferably, the support member consists of sheet metal of a ductile material.

The method of the present invention is primarily characterized by the following steps:
  a) providing the electronic components with tabs having openings;
  b) stamping projecting hollow pins into the support member;
  c) positioning the tabs on the hollow pins such that the hollow pins penetrate the openings;
  d) deforming heads of the hollow pins penetrating the openings to form rivet heads engaging radially outwardly the circumferential edge of the openings for securing the tabs at the support member.

Preferably, the step c) is performed immediately after the step b).

The step c) preferably includes wedging the tabs onto the hollow pins.

The projecting securing pins are stamped from the electrically conducting material of the support member and penetrate openings in the connecting tabs so that a form-locking connection with a high mechanical loadability is provided. The head of the securing pin projecting from the tab of the electronic component is mechanically deformed by crimping so that the head of the crimped hollow pin engages the circumferential edge of the opening within the connecting tab in the radially outward direction and provides a highly loadable, positive-locking connection. By crimping an intimate contact of the hollow pin within the opening of the tab is provided so that an excellent electrically conductive connection is provided which remains unchanged even under mechanical loading.

The inventively designed support member, after being provided with the electronic components, has a great stability so that additional measures with respect to force distribution of the connection are no longer needed.

Preferably, the diameter of the head of the free end of the hollow pin is somewhat smaller than the diameter of the opening within the connecting tab. The diameter at the bottom of the hollow pin, adjacent to the body of the support member, is somewhat greater than the diameter of the opening within the connecting tab. This allows for axially placing the electronic component with connecting tabs onto the hollow pins and wedging them thereon so that additional securing means for fixation of the electronic components during the crimping process of the securing hollow pin are no longer needed.

The axial height of the securing pin is multiple times longer than the thickness of the connecting tab, preferably at least three times as long. In this manner a sufficient overlap of the securing pin and sufficient material for crimping is provided.

With the inventive method the connecting points on the support member are provided by stamping in the form of hollow securing pins and subsequently, the electronic components with their connecting tabs having openings are positioned on the hollow securing pins. The heads projecting from the openings are then deformed like a rivet head in order to engage the circumferential edge of the opening of the connecting tab. By providing this mechanical fixation on the support member, an electrically conducting connection to the support member is simultaneously provided.

BRIEF DESCRIPTION OF THE DRAWINGS

The object and advantages of the present invention will appear more clearly from the following specification in conjunction with the accompanying drawings, in which:

FIG. 1 shows schematically a part-sectional view of a support member with an electronic component having a connecting tab connected to the support member;

FIG. 2 shows a section of the electrically conducting connecting tab of the electric component fastened to the support member;

FIG. 3 shows a plan view of the support member with LEDs connected thereto in an electrically conducting manner.

DESCRIPTION OF PREFERRED EMBODIMENTS

The present invention will now be described in detail with the aid of several specific embodiments utilizing FIGS. 1 through 3.

Illuminated signal lights, such as traffic lights, warning lights, and also tail lights of motor vehicles, are more and more provided with LEDs whereby, for producing a sufficient luminance, a plurality of such LEDs must be employed. As shown in FIG. 3, the LEDs 10 are arranged on a support member 1 which in the shown embodiment is comprised of an electrically conducting sheet metal piece. This sheet metal piece can be comprised of two adjacently arranged sheet metal strips 2 and 3 which, for a preliminary fixation relative to one another, are connected by connecting stays 4. The LEDs 10 with their connecting tabs 11 are mechanically attached to the sheet metal strips 2 and 3 and are then electrically conductively fastened (contacted). For this purpose, the support member 1 has at the respective fastening locations 8 projecting securing pins 5 which penetrate corresponding openings 12 in the connecting tabs 11 of the LEDs 10. As shown in FIG. 2, the heads 7 of the hollow securing pins 5 are crimped so that a mechanically fixed, electrically conducting connection (electrical contact) of the connecting tabs 11 to the sheet metal strips 2 and 3 is ensured. After furnishing the support member 1 with the electrical components, the connecting stays 4 between the sheet metal strips 2 and 3 are removed so that, upon suppling a supply voltage between the sheet metal strips 2 and 3, the LEDs 10 can be operated.

FIG. 1 shows the principle of the mechanical and electrically conducting connection of the support arrangement with connecting tabs 11 attached to the support member 1. At the preselected fastening locations 8 of the support member 1, securing pins 5 are stamped from the material of the electrically conducting sheet metal, respectively, sheet metal strips at the contact side 17. For this purpose, a stamp 20 is provided having a stamp head 21 that is tapered conically.

The smallest head diameter D is approximately 2 mm. The cone angle 22 is expediently within the range of 50°.

If necessary, the side of the sheet metal strip 2 facing away from the stamp 20 can have arranged thereat a matrix in order to support the stamping forces. The stamping process is controlled such that the outer contour of the securing pin 5 is slightly conically tapered. This outer cone angle 9 is very small. It is within the range of 0.5° to 5°.

The interior 16 of the hollow securing pin 5 extends in the direction toward its head in a conically tapering manner whereby the cone angle 19 is approximately 25°. The outer cone angle 9 is thus substantially smaller than the inner cone angle 19.

The wall thickness of the hollow pin 5 is smaller than the thickness d of the support member 1 in the form of a sheet metal piece.

Each hollow pin 5 projects from the contact side 17 of the support member 1 facing the LEDs 10. It may be expedient to provide the support member 1, respectively, the sheet metal strips 2 and 3, on both sides with hollow pins 5 for furnishing both sides of the support member 1 with electronic components. The securing pin 5 extends approximately perpendicularly to the plane of the support member 1.

The connecting tabs 11 of the LEDs are, as can be seen in FIGS. 1 and 2, provided with openings 12. These openings 12 can be embodied completely or only partially within the connecting tab 11. The LEDs 10 are positioned with their connecting tabs 11 such on the support member 1 that the securing pins 5 penetrate the openings 12 within the connecting tabs 11. Expediently, the dimensions are selected such that the diameter K of the free head 7 of the securing pin 5 is slightly smaller than the diameter N of the rivet opening, while the diameter F at the bottom of the hollow securing pin 5 is slightly greater than the diameter N of the opening 12 in the connecting tab 11. Thus, upon placing the connecting tab 11 onto the securing pin 5, a wedging action occurs so that the LEDs 10 can be pre-fixed in their position without any further fixation means on the support member 1.

The height H of the securing pin 5 is greater than the thickness a of the connecting tab 11 so that the securing pin 5 penetrates the connecting tab 11. The head 7 of the securing head 5 projecting from the connecting tab 11 is deformed by a riveting stamp 30, as shown in FIG. 2. The riveting stamp 30 can have a conically shaped riveting head 31 which, in the shown embodiment, has a cone angle 32 of approximately 130°. The deformation of the head of the securing pin 5 can be cylindrical by axial compression and/or forming. With the riveting stamp 30 the head 7 is crimped such that it engages radially outwardly the circumferential edge 13 of the opening 12 so that the connecting tab 11 is securely attached to the support member 1. The riveting stamp 30 is moved during crimping of the head 7 of the securing head 5 in the direction of arrow 33 axially onto the securing pin 5 whereby due to the conical design of the riveting head 31 a lateral material displacement with simultaneously occurring axial compression of the securing pin 5 is produced. This effects, on the one hand, the engagement of the circumferential edge 13 of the opening 12 by the crimped head 7 and, on the other hand, a secure compression of the connecting tab 11 onto the contact side 17 of the electrically conducting support member 1. The connecting tab 11 is thus clamped between the material 6 engaging the circumferential edge 13 and the support member 1 in a play-free manner. The crimping of the hollow securing pin 5 ensures not only a positive-locking mechanical anchoring of the connecting tabs 11 on the support member 1, but also in excellent electrically conduction connection between the connecting tab 11 and the electrically conducting support member 1. The mechanical connection is stable to such a point that the support member 1, even after removal of the connecting stays 4, exhibits a high mechanical stability and an excellent electrically conducting connection even under hardest conditions of use for a long period of time.

It is especially important in this context that the electrically conducting connection of the LEDs 10 to the support member 1 can be produced at a single machining station. In such a station the securing pins 5 are stamped or deep-drawn from the electrically conducting and sufficiently ductile material of the support member 1. With another tool the stamping of the opening 12 within the connecting tab 11 of the LEDs 10 is then performed. The thus stamped connecting tabs 11 are then placed onto the securing pins 5 and, due to the geometric design of the pins 5, are wedged thereon. Without further mechanical auxiliary means, the LEDs 10 are thus securely held on the support member 1. The heads 7 of the securing pins 5 projecting from the connecting tabs 11 are then deformed in a subsequent crimping process in order to engage the circumferential edge of the opening 12 and to attach the connecting tab 11 fixedly, positive-lockingly, and securely at the support 1.

The support member material is expediently a sheet metal which has a sufficient electrical conductivity depending on the prospective use, and, on the other hand, has a sufficient ductility for drawing the securing pins 5. The securing pin 5 can be drawn up to a height H which corresponds approximately to twice the thickness D of the support member material. The connecting tab 11, for example, has a thickness a which is smaller than that of the support material so that the securing pin 5 projects at least by half, preferably more than half, its height H from the opening 12 of the connecting tab 11. This provides for sufficient material in order to crimp by the riveting stamp the head portion so as to provide an electrically conducting, mechanically secure connection of the connecting tab 11 to the support member 1.

The specification incorporates by reference the disclosure of German priority document 197 15 093.4 of Apr. 11, 1997.

The present invention is, of course, in no way restricted to the specific disclosure of the specification and drawings, but also encompasses any modifications within the scope of the appended claims.

What is claimed is:

1. A support arrangement for mechanically securing and electrically contacting electronic components; said support arrangement comprising:

a support member consisting of an electrically conducting material and having a contacting side;

said support member having perpendicularly projecting hollow pins at said contacting side, wherein said hollow pins are stamped into said support member;

wherein the electronic components have connecting tabs including an opening and the tabs are placed onto said hollow pins;

said hollow pins projecting through said openings of said tabs;

wherein heads of said hollow pins are mechanically deformed and engage radially outwardly a circumferential edge of the openings of the tabs.

2. A support arrangement according to claim 1, wherein said hollow pins taper conically toward said head.

3. A support arrangement according to claim 1, wherein a diameter of said head is smaller than a diameter of said opening and wherein a diameter of said hollow pins at said support member is greater than said diameter of said opening.

4. A support arrangement according to claim 1, wherein said hollow pins have a conically shaped interior tapering toward said head.

5. A support arrangement according to claim 4, wherein an exterior cone angle of said hollow pins is smaller than an inner cone angle of said conically shaped interior.

6. A support arrangement according to claim 1, wherein a wall thickness of said support member is greater than a wall thickness of said hollow pins.

7. A support arrangement according to claim 1, wherein said hollow pins, before being mechanically deformed, have a height of twice a wall thickness of said support member.

8. A support arrangement according to claim 8, wherein said hollow pins, before being mechanically deformed, project at least with half said height past said tabs.

9. A support arrangement according to claim 1, wherein said support member consists of sheet metal of a ductile material.

* * * * *